US008716589B2

(12) United States Patent
Haass

(10) Patent No.: US 8,716,589 B2
(45) Date of Patent: May 6, 2014

(54) DOPED LEAD TELLURIDES FOR THERMOELECTRIC APPLICATIONS

(75) Inventor: Frank Haass, Erzhausen (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 666 days.

(21) Appl. No.: 12/293,170

(22) PCT Filed: Jan. 29, 2007

(86) PCT No.: PCT/EP2007/050851
§ 371 (c)(1),
(2), (4) Date: Sep. 16, 2008

(87) PCT Pub. No.: WO2007/104601
PCT Pub. Date: Sep. 20, 2007

(65) Prior Publication Data
US 2009/0084422 A1 Apr. 2, 2009

(30) Foreign Application Priority Data

Mar. 16, 2006 (EP) .................................... 06111281

(51) Int. Cl.
H01L 35/16 (2006.01)
(52) U.S. Cl.
CPC ..................................... H01L 35/16 (2013.01)
USPC ............ 136/238; 139/239; 139/240; 139/201
(58) Field of Classification Search
USPC .......................................................... 438/54
See application file for complete search history.

(56) References Cited

U.S. PATENT DOCUMENTS

| | | | |
|---|---|---|---|
| 3,652,421 A | 3/1972 | Kendall, Jr. et al. | |
| 4,447,277 A * | 5/1984 | Jayadev et al. ............... | 148/400 |
| 5,448,109 A | 9/1995 | Cauchy | |
| 6,225,550 B1 | 5/2001 | Hornbostel et al. | |
| 6,313,392 B1 * | 11/2001 | Sato et al. ...................... | 136/201 |
| 6,660,926 B2 * | 12/2003 | Fleurial et al. ................ | 136/203 |
| 7,002,071 B1 * | 2/2006 | Sadatomi et al. ............. | 136/203 |
| 2003/0168094 A1 * | 9/2003 | Miyasita et al. .............. | 136/240 |
| 2004/0200519 A1 * | 10/2004 | Sterzel et al. .................. | 136/238 |
| 2005/0150537 A1 * | 7/2005 | Ghoshal ......................... | 136/205 |
| 2005/0268956 A1 * | 12/2005 | Take .............................. | 136/208 |
| 2005/0284512 A1 * | 12/2005 | Heremans et al. .......... | 136/236.1 |
| 2006/0249704 A1 * | 11/2006 | Ren et al. ................... | 252/62.3 T |
| 2007/0107764 A1 * | 5/2007 | Kanatzidis et al. ........... | 136/205 |
| 2011/0012069 A1 | 1/2011 | Haass | |

FOREIGN PATENT DOCUMENTS

| | | |
|---|---|---|
| EP | 1 102 334 | 5/2001 |
| WO | WO 2005/114755 | 12/2005 |

OTHER PUBLICATIONS

B A Volkov, et al., "Mixed-Valence Impurities in Lead Telluride-Based Solid Solutions", Physics-Uspekhi, Reviews of Topical Problems, vol. 45, No. 8, 2002, pp. 819-846.
E. P. Skipetrov, et al., "Energy Spectrum and Parameters of Deep Impurity Level in $Pb_{1-x}Ge_xTe$ Alloys Doped with Yb", Physical Review B, vol. 59, No. 20, May 15, 1999, pp. 12928-12934.
S. A. Nemov, et al., "Effect of Low-Level Ge Additions on the Superconducting Transition in PbTe:Tl", Physics of the Solid State, vol. 40, No. 7, Jul. 1998, pp. 1096-1097.
M K Zhitinskaya, et al., "Transport Phenomena in P-Type PbTe:Ag:Na", Soviet Physics—Semiconductors, vol. 24, No. 2, Feb. 1990, pp. 178-180 (submitting English Abstract only).
V D Vulchev, et al., "Influence of 3-d Transition Metal Impurities on Some Electronic Properties of PbTe", Annuaire de l'Universite de Sofia 'St. Kliment Ohridski' Faculte de Physique, vol. 83-84, 1992, pp. 89-109 (submitting English Abstract only).
V. F. Chishko, et al., "Photoelectric Properties of $Pb_{1-x-y}Ge_ySn_xTe$:In Epitaxial Films", SPIE, vol. 3182, 0277-786X, 1997), pp. 115-121.
Hitoshi Kohri, et al., "Improvement of Thermoelectric Properties for n-type PbTe by Adding Ge", Materials Science Forum, vols. 423-425, (2003), pp. 381-384, XP008035344.
Jae-Shik Choi, et al., "Thermoelectric Properties of n-Type $(Pb_{1-x}Ge_x)Te$ Fabricated by Hot Pressing Method", 16th International Conference on Thermoelectrics, 7803-4057, (1997), pp. 228-231, XP-002296046.
Boris A. Akimov, et al., "Thermally Induced Currents and Instabilities of Photoresponse in the PbTe(In)based films", SPIE, vol. 3890, 0277-786X, (1999), pp. 208-211, 0277-786X.

* cited by examiner

Primary Examiner — Jayne Mershon
(74) Attorney, Agent, or Firm — Oblon, Spivak, McClelland, Maier & Neustadt, L.L.P.

(57) ABSTRACT

A p- or n-conductive semiconductor material comprises a compound of the general formula (I)

$$Pb_{1-(x1+x2+\ldots+xn)}A^1_{x1}A^2_{x2}\ldots A^n_{xn}Te_{1+z} \quad (I)$$

where:
in each case independently
n is the number of chemical elements different from Pb and Te
1 ppm ≤ x1 ... xn ≤ 0.05
−0.05 ≤ z ≤ 0.05
and
n ≥ 2
$A^1 \ldots A^n$ are different from one another and are selected from the group of the elements Li, Na, K, Rb, Cs, Be, Mg, Ca, Sr, Ba, Al, Ga, In, Tl, Si, Ge, Sn, As, Sb, Bi, S, Se, Br, I, Sc, Y, La, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, Ce, Pr, Nd, Sm, Eu, Gd, Tb, Dy, Ho, Er, Tm, Yb, Lu
or n=1
$A^1$ is selected from Ti, Zr, Ag, Hf, Cu, Gr, Nb, Ta.

8 Claims, No Drawings

DOPED LEAD TELLURIDES FOR THERMOELECTRIC APPLICATIONS

The present invention relates to semiconductor materials comprising lead and tellurium and at least one or two further dopants, and to thermoelectric generators and Peltier arrangements comprising them.

Thermoelectric generators and Peltier arrangements as such have been known for some time. p- and n-doped semiconductors which are heated on one side and cooled on the other side transport electrical charges through an external circuit, and electrical work can be performed by a load in the circuit. The efficiency of conversion of heat to electrical energy achieved in this process is limited thermodynamically by the Carnot efficiency. Thus, at a temperature of 1000 K on the hot side and 400 K on the "cold" side, an efficiency of (1000-400): 1000=60% would be possible. However, only efficiencies of up to 10% have been achieved to date.

On the other hand, when a direct current is applied to such an arrangement, heat is transported from one side to the other side. Such a Peltier arrangement works as a heat pump and is therefore suitable for cooling apparatus parts, vehicles or buildings. Heating via the Peltier principle is also more favorable than conventional heating, because more heat is always transported than corresponds to the energy equivalent supplied.

A good review of thermoelectric effects and materials is given, for example, by Cronin B. Vining, ITS Short Course on Thermoelectricity, Nov. 8, 1993 Yokohama, Japan.

At present, thermoelectric generators are used in space probes for generating direct currents, for cathodic corrosion protection of pipelines, for energy supply to light buoys and radio buoys, for operating radios and television sets. The advantages of thermoelectric generators lie in their extreme reliability. For instance, they work irrespective of atmospheric conditions such as atmospheric moisture; there is no fault-prone mass transfer, but rather only charge transfer; the fuel is combusted continuously, and catalytically without a free flame, which releases only small amounts of CO, $NO_x$ and uncombusted fuel; it is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

A particularly attractive application would be the use for conversion to electrical energy in electrically operated vehicles. There would be no need for this purpose to undertake any change in the existing network of gas stations. However, efficiencies greater than 30% would be required for such an application.

The conversion of solar energy directly to electrical energy would also be very attractive. Concentrators such as parabolic troughs can concentrate solar energy with efficiencies of around 95 to 97% to thermoelectric generators, which generates electrical energy.

However, higher efficiencies are also needed for utilization as a heat pump.

Thermoelectrically active materials are rated essentially with reference to their efficiency. A characteristic of thermoelectric materials in this regard is what is known as the Z factor (figure of merit):

$$Z = \frac{S^2 \cdot \sigma}{\kappa}$$

with the Seebeck coefficient S, the electrical conductivity $\sigma$ and the thermal conductivity $\kappa$. Preference is given to thermoelectric materials which have a very low thermal conductivity, a very high electrical conductivity and a very large Seebeck coefficient, so that the figure of merit assumes a very high value.

The product $S^2\sigma$ is referred to as the power factor and serves to compare thermoelectric materials.

In addition, the dimensionless product Z·T is often also reported for comparative purposes. Thermoelectric materials known to date have maximum values of Z·T of about 1 at an optimal temperature. Beyond this optimal temperature, the values of Z·T are often lower than 1.

A more precise analysis shows that the efficiency $\eta$ is calculated from $$\eta = \frac{T_{high} - T_{low}}{T_{high}} \frac{M-1}{M + \frac{T_{low}}{T_{high}}}$$

where $$M = \left[1 + \frac{Z}{2}(T_{high} + T_{low})\right]^{\frac{1}{2}}$$

(see also Mat. Sci. and Eng. B29 (1995) 228).

The aim is thus to provide a thermoelectric material having a very high value of Z and a high realizable temperature differential. From the point of view of solid state physics, many problems have to be overcome here:

A high $\sigma$ requires a high electron mobility in the material, i.e. electrons (or holes in p-conducting materials) must not be bound strongly to the atomic cores. Materials having high electrical conductivity $\sigma$ usually simultaneously have a high thermal conductivity (Wiedemann-Franz law), which does not allow Z to be influenced favorably. Materials used at present, such as $Bi_2Te_3$, already constitute compromises. For instance, the electrical conductivity is lowered by alloying to a lesser extent than the thermal conductivity. Preference is therefore given to using alloys, for example $(Bi_2T_3)_{90}(Sb_2T_3)_5(Sb_2Se_3)_5$ or $Bi_{12}Sb_{23}Te_{65}$, as described in U.S. Pat. No. 5,448,109.

For thermoelectric materials having high efficiency, still further boundary conditions preferably have to be fulfilled. In particular, they have to be sufficiently thermally stable in order to be able to work under operating conditions for years without significant loss of efficiency. This requires a phase which is thermally stable at high temperatures per se, a stable phase composition, and also negligible diffusion of alloy constituents into the adjoining contact materials.

In the more recent patent literature, descriptions of thermoelectric materials can be found, for example in U.S. Pat. No. 6,225,550 and EP-A-1 102 334.

U.S. Pat. No. 6,225,550 relates essentially to materials composed of $Mg_xSb_z$ which are doped with a further element, preferably a transition material.

EP-A-1 102 334 discloses p- or n-doped semiconductor materials which comprise at least one ternary material from the substance classes of the suicides, borides, germanides, tellurides, sulfides, selenides, antimonides, plumbides and semiconducting oxides.

The article "Thermoelectric properties of n-type $(Pb_{1-x}Ge_x)Te$ fabricated by hot pressing method", Proceedings ICT, XVI. International Conference on Thermoelectrics, Aug. 26-29, 1997, Dresden, pages 228 to 231 describes a process for preparing ternary compounds of the formula $(Pb_{1-x}Ge_x)Te$ where x=from 0 to 0.15, the system being doped with 0.3% Bi. The material is obtained by loading the appropriate amount of Pb, Ge, Te and Bi into a quartz tube which has been coated on the interior with carbon, subsequently evacuating, sealing and heating to 1000° C. for 2 hours in a rotary furnace. Subsequently, the system is cooled to room temperature. The $(Pb_{1-x}Ge_x)Te$ blocks are then generated in a melt zone furnace at 1000° C. at a growth rate of 1 mm/min. The blocks are subsequently ground to a powder having a size of from 90 to 250 µm. This is followed by a reduction treatment at 400° C. for 24 hours in a $H_2$/Ar atmosphere. The powders are compressed cold and subsequently hot at from 650 to 750° C. under reduced pressure. With reference to the thus obtained materials, it has been found that the Seebeck coefficient and the electrical resistance of the thermoelectric materials rise with the GeTe content x in the semiconductor material, while the thermal conductivity falls with the rise in the GeTe content x in the semiconductor material. The best Seebeck coefficient obtained is about −150 µV/K, and the electrical resistivity is 1 mΩ/cm. The thermal conductivity is a minimum of 2 W/(m·K).

Starting from this prior art, it is an object of the present invention to provide semiconductor materials (thermoelectrically active materials) which have a high efficiency and exhibit a suitable property profile for varying fields of application.

The object is achieved in accordance with the invention by a semiconductor material comprising a compound of the general formula (I)

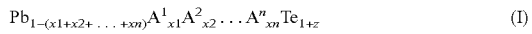

where:
in each case independently
n is the number of chemical elements different from Pb and Te
1 ppm ≤ x1 ... xn ≤ 0.05
−0.05 ≤ z ≤ 0.05
and
n ≥ 2
$A^1 ... A^n$ are different from one another and are selected from the group of the elements Li, Na, K, Rb, Cs, Be, Mg, Ca, Sr, Ba, Al, Ga, In, Tl, Si, Ge, Sn, As, Sb, Bi, S, Se, Br, I, Sc, Y, La, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, Ce, Pr, Nd, Sm, Eu, Gd, Tb, Dy, Ho, Er, Tm, Yb, Lu, are preferably different from one another and are selected from the group of the elements Al, In, Si, Ge, Sn, Sb, Bi, Se, Ti, Zr, Hf, Nb, Ta, Cu, Ag, Au, and are in particular different from one another and selected from the group of the elements In, Ge, Ti, Zr, Hf, Nb, Ta, Cu, Ag
or
n=1
$A^1$ is selected from Ti, Zr, Ag, Hf, Cu, Gr, Nb, Ta.
n is preferably 2, 3 or 4, more preferably 2 or 3, in particular 2. It is then an at least quaternary compound. In the case that n=1, it is a ternary compound, for example, or preferably of the (Pb, Ti) Te, (Pb, Zr) Te or (Pb, Ag) Te type.

The present invention thus envisages that, starting from PbTe, in a formal sense
Pb or Te are replaced by one or at least two dopants or
one or at least two dopants are added to PbTe or
one or at least two dopants assume some of the Pb or Te positions,
where the ratio of Pb:Te—starting from 1:1—changes in each case.

For the inventive materials of the series, Seebeck coefficients in the range from generally 150 to 400 µV/K are achieved for p-conductors, and generally from −150 to −400 µV/K with a marked temperature difference of 270° C., the hot side being 300° C., for n-conductors. The power factors achieved at room temperature are generally at least 20 µW/$K^2$·cm.

According to the invention, the materials may also comprise further compounds or dopants, provided that the aforementioned Seebeck coefficients and power factors are retained. For example, it is possible that from 0 to 10% by weight of the compound is substituted for other metals or metal compounds which likewise function as p- or n-dopants.

The inventive materials are generally prepared by reactive grinding or preferably by co-melting and reaction of mixtures of the particular element constituents or alloys thereof. A reaction time of the reactive grinding or preferably co-melting of at least one hour has generally been found to be advantageous.

The co-melting and reaction is effected preferably over a period of at least 1 hour, more preferably at least 6 hours, in particular at least 10 hours. The melting process can be effected with or without mixing of the starting mixture. When the starting mixture is mixed, suitable apparatus for this purpose is a rotary or tilting furnace, in order to ensure the homogeneity of the mixture.

If no mixing is undertaken, longer melting times are generally required in order to obtain a homogeneous material. If mixing is undertaken, homogeneity in the mixture is obtained at an earlier stage.

Without additional mixing of the starting mixtures, the melting time is generally from 2 to 50 hours, in particular from 30 to 50 hours.

The co-melting is effected generally at a temperature at which at least one constituent of the mixture has already melted and the material is already in the molten state. In general, the melting temperature is at least 800° C., preferably at least 950° C. Typically, the melting temperature is within a temperature range of from 800 to 1100° C., preferably from 950 to 1050° C.

After the molten mixture has cooled, the material is calcined at a temperature of generally at least 100° C., preferably at least 200° C., lower than the melting point of the resulting semiconductor material. Typically, the calcination temperature is from 450 to 750° C., preferably from 550 to 700° C.

The heat treatment is carried out over a period of preferably at least 1 hour, more preferably at least 2 hours, in particular at least 4 hours. Typically, the calcination time is from 1 to 8 hours, preferably from 6 to 8 hours. In one embodiment of the present invention, the heat treatment is carried out at a temperature which is from 100 to 500° C. lower than the melting point of the resulting semiconductor material. A preferred temperature range is from 150 to 350° C. lower than the melting point of the resulting semiconductor material.

The inventive thermoelectric materials are prepared generally in a heatable quartz tube. Mixing of the components involved can be ensured by using a rotatable and/or tiltable furnace. On completion of the conversion, the furnace is cooled. Subsequently, the quartz tube is taken from the furnace and the semiconductor material present in the form of blocks is cut into slices. These slices are then cut into pieces of length from about 1 to 5 mm, from which thermoelectric modules can be obtained.

Instead of a quartz tube, it is also possible to use tubes made of other materials inert toward the semiconductor material, for example of tantalum. This is preferred, since the thermal conductivity of this material is higher than that of quartz.

Instead of tubes, it is also possible to use containers of a suitable shape. It is also possible to use other materials, for example graphite, as the vessel material, provided that they are inert toward the semiconductor material.

In one embodiment of the present invention, the cooled material may be ground wet, dry or in another way at suitable temperature, so that the inventive semiconductor material is obtained in customary particle sizes of less than 10 μm. The ground inventive material is then extruded hot or cold or preferably compressed hot or cold to moldings which have the desired shape. The molded density of the moldings compressed in this way should preferably be greater than 50%, more preferably greater than 80%, than the molded density of the crude material in the uncompressed state. Compounds which improve the consolidation of the inventive material may be added in amounts of preferably from 0.1 to 5% by volume, more preferably from 0.2 to 2% by volume, based in each case on the powdered inventive material. Additives which are added to the inventive materials should preferably be inert toward the semiconductor material and preferably emerge from the inventive material during the heating to temperatures below the sintering temperature of the inventive materials, if appropriate under inert conditions and/or reduced pressure. After the compression, the compressed parts are preferably introduced into a sintering furnace in which they are heated to a temperature of preferably at most 20° C. below the melting point.

The compressed parts are sintered at a temperature of generally at least 100° C., preferably at least 200° C., lower than the melting point of the resulting semiconductor material. Typically, the sintering temperature is from 350 to 750° C., preferably from 600 to 700° C. It is also possible to perform spark-plasma sintering (SPS) or microwave sintering.

The sintering is carried out over a period of preferably 0.5 hour, more preferably at least 1 hour, in particular at least 2 hours. Typically, the calcination time is from 0.5 to 5 hours, preferably from 1 to 3 hours. In one embodiment of the present invention, the sintering is carried out at a temperature which is from 100 to 600° C. lower than the melting point of the resulting semiconductor material. A preferred temperature range is from 150 to 350° C. lower than the melting point of the resulting semiconductor material. Preference is given to carrying out the sintering under hydrogen or a protective gas atmosphere, for example of argon.

Thus, the compressed parts are preferably sintered to from 95 to 100% of their theoretical bulk density.

Overall, a preferred embodiment of the present inventive process which thus arises is a process which is characterized by the following process steps:

(1) co-melting mixtures of the particular elemental constituents, or alloys thereof, of the at least quaternary or ternary compound;
(2) grinding the material obtained in process step (1);
(3) pressing the material obtained in process step (2) to moldings and
(4) sintering the moldings obtained in process step (3).

The present invention further provides the use of the above-described semiconductor material and of the semiconductor material obtainable by the above-described process as a thermoelectric generator or Peltier arrangement.

The present invention further provides thermoelectric generators or Peltier arrangements which comprise the above-described semiconductor material and/or the semiconductor material obtainable by the above-described process.

The present invention further provides a process for producing thermoelectric generators or Peltier arrangements, in which thermoelectrically active legs connected in series are used with thin layers of the above-described thermoelectric materials.

In a first embodiment of this process, the thermoelectric generators or Peltier arrangements are produced as follows:

The inventive semiconductors of a first conductor type (p- or n-doped) are applied to a substrate by means of conventional semiconductor manufacturing techniques, in particular CVD, sputtering techniques or molecular beam epitaxy.

The inventive semiconductors are likewise applied to a further substrate, likewise by means of the sputtering technique or molecular beam epitaxy, although the conductor type of this semiconductor material is in this case inverse to that of the semiconductor material first used (n- or p-doped).

The two substrates are now arranged one on top of the other in a sandwich like manner, so that thermoelectrically active legs of in each case a different charge type are arranged alternately.

The individual thermoelectrically active legs have a diameter of preferably less than 100 μm, more preferably less than 50 μm, in particular less than 20 μm, and a thickness of preferably from 5 to 100 μm, more preferably from 10 to 50 μm, in particular from 15 to 30 μm. The surface area taken up by one thermoelectrically active leg is preferably less than 1 $mm^2$, preferably less than 0.5 $mm^2$, in particular less than 0.4 $mm^2$.

In a second embodiment, the thermoelectric generators or Peltier arrangements are produced in such a way that suitable deposition methods, for example molecular beam epitaxy, are used to generate alternating layers of inventive semiconductor materials of different charge type (p- and n-doped) on a substrate. The layer thickness is in each case preferably from 5 to 100 nm, more preferably from 5 to 50 nm, in particular from 5 to 20 nm.

The inventive semiconductor materials may also be combined by methods to give thermoelectric generators or Peltier arrangements, these methods being known per se to those skilled in the art and being described, for example, in WO 98/44562, U.S. Pat. No. 5,448,109, EP-A-1 102 334 or U.S. Pat. No. 5,439,528.

The inventive thermoelectric generators or Peltier arrangements widen in a general sense the present range of thermoelectric generators and Peltier arrangements. Variation of the chemical composition of the thermoelectric generators or Peltier arrangements make it possible to provide different systems which satisfy different requirements in a multitude of possible applications. The inventive thermoelectric generators or Peltier arrangements thus widen the application spectrum of these systems.

The present invention also relates to the use of an inventive thermoelectric generator or of an inventive Peltier arrangement
    as a heat pump
    for climate control of seating furniture, vehicles and buildings
    in refrigerators and (laundry) dryers
    for simultaneous heating and cooling of streams in processes for separation such as
        absorption
        drying
        crystallization
        evaporation
        distillation
    as a generator for utilization of heat sources such as
        solar energy
        geothermal heat
        heat of combustion of fossil fuels
        waste heat sources in vehicles and stationary units
        heat sinks in the evaporation of liquid substances
        biological heat sources
    for cooling electronic components.

The present invention further relates to a heat pump, to a refrigerator, to a (laundry) dryer or to a generator for utilizing heat sources, comprising at least one inventive thermoelectric generator or an inventive Peltier arrangement, by means of which a material to be dried is heated directly or indirectly in the (laundry) dryer and by means of which the water or solvent vapor which arises in the course of drying is cooled directly or indirectly.

In a preferred embodiment, the dryer is a laundry dryer and the material to be dried is laundry.

The present invention is illustrated in detail with reference to the examples described below.

WORKING EXAMPLES

The Seebeck coefficient is determined by placing the material to be examined between a hot and a cold contact, each of which is heated electrically, the hot contact having a temperature of from 200 to 300° C. The cold side is kept at room temperature, so as to result in a $\Delta T$ of typically from 150 to 280° C. The measured voltage at the particular temperature difference between hot and cold contact affords the Seebeck coefficient reported in each case.

The electrical conductivity is measured at room temperature by a four-point measurement. The process is known to those skilled in the art.

Quaternary Materials

Example 1

Element powder in amounts according to the composition $Pb_{0.992}Ge_{0.005}Ti_{0.003}Te_{1.003}$ (purities: Pb≥99.999%, Te≥99.999%, Ge≥99.999%, Ti≥99.99%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=1641.4$ S cm$^{-1}$, the Seebeck coefficient $S=-165.4$ µV K$^{-1}$ (measured using $T_{cold}=50°$ C., $T_{hot}=280°$ C.), corresponding to a power factor of $S^2 \sigma=44.9$ µW K$^{-2}$ cm$^{-1}$.

Example 2

Element powder in amounts according to the composition $Pb_{0.992}Ge_{0.005}Ti_{0.003}Te_{1.003}$ (purities: Pb≥99.999%, Te≥99.999%, Ge≥99.999%, Zr≥99.95%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=2485.9$ S cm$^{-1}$, the Seebeck coefficient $S=-132.1$ µV K$^{-1}$ (measured using $T_{cold}=50°$ C., $T_{hot}=285°$ C.), corresponding to a power factor of $S^2 \sigma=43.4$ µW K$^{-2}$ cm$^{-1}$.

Example 3

Element powder in amounts according to the composition $Pb_{0.99}Bi_{0.005}Al_{0.005}Te_{1.001}$ (purities: Pb≥99.999%, Te≥99.999%, Al≥99.999%, Bi≥99.998%) was weighted into a quartz ampule, internal diameter 1 cm. The amount of sample was 20 g. The ampule was evacuated and sealed. Subsequently, the ampule was heated to 1000° C. at 100 K h$^{-1}$ in a furnace and kept at this temperature for 15 h. The contents of the ampule were mixed continuously by tilting motions of the furnace. After the reaction time, the upright furnace was switched off to cool it to room temperature.

A compact, matt silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=992.0$ S cm$^{-1}$, the Seebeck coefficient $S=-154.6$ µV K$^{-1}$ (measured using $T_{cold}=40°$ C., $T_{hot}=280°$ C.), corresponding to a power factor of $S^2 \sigma=23.7$ µW K$^{-2}$ cm$^{-1}$.

Example 4

Element powder in amounts according to the composition $Pb_{0.989}Ge_{0.01}Ag_{0.001}Te_{1.001}$ (purities: Pb≥99.999%, Te≥99.999%, Ge≥99.999%, Ag≥99.9999%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=407.3$ S cm$^{-1}$, the Seebeck coefficient $S=-326.5$ µV K$^{-1}$ (measured using $T^{cold}=50°$ C., $T_{hot}=290°$ C.), corresponding to a power factor of $S^2 \sigma=43.4$ µW K$^{-2}$ cm$^{-1}$.

Example 5

Element powder in amounts according to the composition $Pb_{0.987}Ge_{0.01}Sn_{0.03}Te_{1.001}$ (purities: Pb≥99.999%, Te≥99.999%, Ge≥99.999%, Sn≥99.9985%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=249.4$ S cm$^{-1}$, the Seebeck coefficient $S=-290.4\,\mu V\,K^{-1}$ (measured using $T_{cold}=40°$ C., $T_{hot}=285°$ C.), corresponding to a power factor of $S^2\sigma=21.0\,\mu W\,K^{-2}\,cm^{-1}$.

Ternary Materials

Example 1

Element powder in amounts according to the composition $Pb_{0.997}Zr_{0.03}Te_{1.003}$ (purities: Pb≥99.999%, Te≥99.999%, Zr≥99.95%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=3895.7$ S cm$^{-1}$, the Seebeck coefficient $S=-139.4\,\mu V\,K^{-1}$ (measured using $T_{cold}=50°$ C., $T_{hot}=280°$ C.), corresponding to a power factor of $S^2\sigma=75.7\,\mu W\,K^{-2}\,cm^{-1}$.

Example 2

Element powder in amounts according to the composition $Pb_{0.997}Zr_{0.003}Te_{1.003}$ (purities: Pb≥99.999%, Te≥99.999%, Zr≥99.95%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=3587.4$ S cm$^{-1}$, the Seebeck coefficient $S=-137.7\,\mu V\,K^{-1}$ (measured using $T_{cold}=50°$ C., $T_{hot}=280°$ C.), corresponding to a power factor of $S^2\sigma=68.0\,\mu W\,K^{-2}\,cm^{-1}$.

Example 3

Element powder in amounts according to the composition $Pb_{0.999}Ag_{0.001}Te_{1.003}$ (purities: Pb≥99.999%, Te≥99.999%, Ag≥99.9999%) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=451.2$ S cm$^{-1}$, the Seebeck coefficient $S=-314.5\,\mu V\,K^{-1}$ (measured using $T_{cold}=50°$ C., $T_{hot}=280°$ C.), corresponding to a power factor of $S^2\sigma=44.6\,\mu W\,K^{-2}\,cm^{-1}$.

Example 4

Element powder in amounts according to the composition $Pb_{0.995}Cu_{0.005}Te_{1.003}$ (purities: Pb≥99.999%, Te≥99.999%, Cu of electrolytic purity) was weighted into a quartz ampule, internal diameter 1 cm. The amount of sample was 20 g. The ampule was evacuated and sealed. Subsequently, the ampule was heated to 980° C. at 500 K h$^{-1}$ in a furnace and kept at this temperature for 6 h. The contents of the ampule were mixed continuously by tilting motions of the furnace. After the reaction time, the upright furnace was cooled to 600° C. at 100 K h$^{-1}$, and the material was heat-treated at this temperature for 24 h. Subsequently, the furnace was cooled to room temperature at 60 K h$^{-1}$.

A compact, silver-shiny regulus was obtained, which could be removed from the ampule without any problem. A diamond wire saw was used to cut an approx. 2 mm-thick slice out of the regulus, and first the electrical conductivity at room temperature and then the Seebeck coefficient were measured thereon.

The electrical conductivity was $\sigma=1936.5$ S cm$^{-1}$, the Seebeck coefficient $S=-136.7\,\mu V\,K^{-1}$ (measured using $T_{cold}=50°$ C., $T_{hot}=280°$ C.), corresponding to a power factor of $S^2\sigma=36.2\,\mu W\,K^{-2}\,cm^{-1}$.

The invention claimed is:

1. A p- or n-conductive semiconductor material consisting essentially of a compound of the general formula (I)

$$Pb_{1-(x1+x2)}A^1_{x1}A^2_{x2}Te_{1+z} \qquad (I)$$

where:
in each case independently
1 ppm≤x1, x2≤0.05
−0.05≤z≤0.05
and
wherein
A$^1$ . . . and A$^2$ are different from one another and are selected from the group of the elements Ge, Ti, Zr, Hf, Nb and Ta.

2. The p- or n-conductive semiconductor material according to claim 1, wherein $A^1$ is Ge and $A^2$ is selected from the group of the elements Ti and Zr.

3. A process for preparing a semiconductor material according to claim 1, wherein the compound is prepared by reactive grinding or co-melting mixtures of the particular element constituents or alloys thereof.

4. The process according to claim 3, characterized by the following process steps:
   (1) co-melting mixtures of the particular elemental constituents or alloys thereof of the compound;
   (2) grinding the material obtained in process step (1);
   (3) pressing the material obtained in process step (2) to moldings and
   (4) sintering the moldings obtained in process step (3).

5. A semiconductor material obtainable by the process according to claim 3.

6. A semiconductor material obtainable by the process according to claim 4.

7. A thermoelectric generator or Peltier arrangement comprising a semiconductor material according to claim 1.

8. A heat pump, refrigerator, (laundry) dryer, generator for utilizing heat sources, comprising at least one thermoelectric generator or a Peltier arrangement according to claim 7.

* * * * *